(12) United States Patent
Xu et al.

(10) Patent No.: US 6,335,149 B1
(45) Date of Patent: *Jan. 1, 2002

(54) HIGH PERFORMANCE ACRYLATE MATERIALS FOR OPTICAL INTERCONNECTS

(75) Inventors: Chengzeng Xu, Succasunna; Chengjiu Wu, Morristown; Kelly M. T. Stengel; Lawrence W. Shacklette, both of Maplewood; Louay Eldada, Rockaway; James T. Yardley, Morristown, all of NJ (US)

(73) Assignee: Corning Incorporated, Corning, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/838,344

(22) Filed: Apr. 8, 1997

(51) Int. Cl.[7] ................................................. G02B 6/12
(52) U.S. Cl. ..................... 430/321; 430/394; 385/129; 385/132
(58) Field of Search .................. 430/321, 320, 430/270.1, 394; 385/129, 132

(56) References Cited

U.S. PATENT DOCUMENTS

| | | | |
|---|---|---|---|
| 4,376,160 A | * 3/1983 | Evanchuck | 430/321 |
| 4,609,252 A | * 9/1986 | Wong et al. | 430/321 |
| 5,136,682 A | 8/1992 | Moyer et al. | 385/141 |
| 5,265,185 A | * 11/1993 | Ashley et al. | 385/132 |
| 5,359,687 A | * 10/1994 | McFarland et al. | 430/321 |
| 5,462,700 A | * 10/1995 | Beeson et al. | 385/146 |
| 5,656,241 A | * 8/1997 | Seifert et al. | 422/82.06 |

FOREIGN PATENT DOCUMENTS

| | | | | |
|---|---|---|---|---|
| DE | 2151781 | * | 4/1973 | 385/129 |
| GB | 1372578 | * | 10/1974 | |
| GB | 2170923 | * | 8/1986 | 385/129 |
| JP | 1-138509 | * | 5/1989 | 385/129 |
| JP | 1-237505 | * | 9/1989 | 385/129 |

OTHER PUBLICATIONS

"Polymeric Optical Waveguide Switch Using the Thermooptic Effect," *J. of Lightwave Tech.*, vol. 7, No.3, pp. 449–453, Mar., 1989.

* cited by examiner

*Primary Examiner*—Martin Angebranndt
(74) *Attorney, Agent, or Firm*—Nixon Peabody LLP

(57) ABSTRACT

The invention provides organic optical waveguide devices which are lithographically formed and employ polymeric materials having low optical loss, good long term and short term stability, good flexibility and reduced stress or crack induced scattering loss. An optical element has a substrate; a patterned, light transmissive core composition on the surface of the substrate; and a light reflecting cladding composition on the pattern of the core. The core composition has a glass transition temperature of about 80° C. or less and the cladding composition has a glass transition temperature of about 60° C. or less.

9 Claims, No Drawings

HIGH PERFORMANCE ACRYLATE MATERIALS FOR OPTICAL INTERCONNECTS

BACKGROUND OF THE INVENTION

The present invention relates to organic optical devices such as waveguides, or more particularly to lithogrhically formed optical waveguides employing polymeric materials having low optical loss, good long term and short term stability, good flexibility and reduced stress or crack induced optical scattering loss.

In optical communication systems, messages are transmitted by carrier waves at optical frequencies that are generated by such sources as lasers and light-emitting diodes. There is interest in such optical communication systems because they offer several advantages over conventional communication systems. They have a greatly increased number of channels of communication as well as the ability to transmit messages at much higher speeds than electronic systems using copper wires. This invention can be used in the formation of the light transmissive element of optical devices. Ilustrative of such devices are planar optical slab waveguides, channel optical waveguides, rib waveguides, optical couplers, optical splitters, optical switches, micro-optical elements and the like which are described in more detail in U.S. Pat. Nos. 4,609,252; 4,877, 717; 5,136,682; 5,481,385; 5,462,700; 5,396,350 and 5,428, 468. All of the foregoing patents are incorporated herein by reference. One preferred means for switching or guiding waves of optical frequencies from one point to another is by an optical waveguide. The operation of an optical waveguide is based on the fact that when a medium which is transparent to light is surrounded or otherwise bounded by another medium having a lower refractive index, light introduced along the inner medium's axis is highly reflected at the boundary with the surrounding medium, thus producing a guiding effect.

It is known in the art to produce polymeric optical waveguides and other optical interconnect devices which transport optical signals in optical circuitry or fiber optic networks. One method used to form an optical device involves the application of standard photolithographic processes. Photopolymers are of particular interest for optical interconnect applications because they can be patterned with photolithographic techniques which have been well developed. By this process, lithographic processes are used to define a pattern in a light sensitive layer deposited on a chosen substrate. By standard photolithographic processes, a pattern is developed in the light-sensitive material. Among the many known photopolymers, acrylate materials have been widely studied as waveguide materials because of their optical clarity, low birefringence and ready availability of a wide range monomers. However, the optical performance of such a structure has been poor, since optical losses as well as the aging resistance of exposed material have been unsatisfactory. The devices made from these materials have high optical loss and have turned from clear to yellow and then to brown during thermal baking at high temperatures ($\geqq 120°$ C.) in air, exhibiting increased absorption loss. Thermal stability of waveguide materials is extremely important for practical device applications. Thermal degradation of materials during prolonged use at high temperatures will cause failure of a device. Additionally, for optical polymers, thermal yellowing will increase optical loss and will reduce the lifetime of the device. The other problem associated with the earlier generation acrylic materials is that they are very brittle and the devices made from them crack upon baking. Waveguides often need to be bent 90 degrees either in-plane or out-of-plane. This requires flexible cladding and core materials to avoid cracking and optical losses due to bending-induced stress. An object of the invention is to provide materials with low optical loss, good thermal stability, good adhesion to a variety of substrates and sufficient flexibility to allow right angle bends.

U.S. Pat. No. 4,609,252 teaches one method of lithographically forming optical elements using an acrylic photoactive composition which is capable of forming a waveguide material upon polymerization. However, this patent teaches one to utilize polymers with as high a glass transition temperature as possible in order to provide for the greatest operating temperatures. Glass transition temperatures of $90°$ C.$-220°$ C. are required. U.S. Pat. No. 5,136,682 teaches the production of waveguides using light polymerzable compositions such as acrylics having a Tg of at least $100°$ C. The foregoing waveguides suffer from undesirably high optical loss and are not very flexible.

It would be desirable to produce optical devices from polymeric materials which have short term thermal stability at temperatures above $200°$ C. for device integration and packaging, long term stability at $120°$ C. for long term operation, low absorption and scattering loss at application wavelengths, flexibility to facilitate device designs in different geometry, have precisely controllable refractive indexes for mode and numeric aperture control and compatibility with existing technologies.

The present invention provides polymers for optical devices that address the above-mentioned problems. The polymeric materials offer low optical loss (0.02 dB/cm at a wavelength of 810 nm), good long term stability at $120°$ C. and short term stability at $200°$ C. Aging induced loss is lower than 0.1 dB/cm over a device lifetime of five years or longer at $125°$ C. Good flexibility enables the materials to be used in various device geometries and reduces stress or cracking induced scattering loss. Precise refractive index control allows control of mode and numeric aperture and permits fabrication of single mode waveguides that match single-mode fibers in both cross sectional dimensions and numeric aperture. The compositions also have sufficient adhesion to a variety inorganic and organic substrates. The materials are colorless and exhibit extremely low intrinsic absorption loss between 400 and 1000 nm. Their flexibility minimizes scattering losses caused by stress and microcracks. Their high photolithography contrast allows for formation of smooth walls and thus reduces scattering loss at the interfaces of a multi-layer structure. All of these material properties contribute to the extremely low losses of the waveguides. Thermally induced optical losses due to yellowing are minimized. These core and cladding materials are miscible with one another, so the index at each layer of a waveguide can be precisely tailored by mixing selected pair of high index and low index solutions. This property can be used to precisely control the mode of a waveguide and can be used to fabricate large-size single-mode waveguides that match commercial single-mode fibers in both cross sectional dimensions and numeric aperture.

DESCRIPTION OF THE INVENTION

The invention provides a method of producing an optical element which comprises:
a) coating a first photosensitive composition onto a substrate, which first photosensitive composition comprises an admixture of at least one first free radical polymerizable monomer, oligomer or polymer component having at least one ethylenically unsaturated group and at least one first photoinitiator, wherein said first photoinitiator is present in sufficient amount to initiate the free radical polymerization of said polymerizable component upon imagewise exposure to sufficient actinic radiation, wherein said first polymerizable component is present in sufficient amount to provide image differentiation when the first photosensitive composition is imagewise exposed to sufficient actinic radiation;

b) imagewise exposing the first photosensitive composition to sufficient actinic radiation to effect a polymerization thereof and forming image areas and non-image areas; and then removing the non-image areas while not removing the image areas, which image areas form a light transmissive patterned core;

c) coating a second photosensitive composition onto the patterned core, which second photosensitive composition comprises an admixture of at least one second free radical polymerizable monomer, oligomer or polymer component having at least one ethylenically unsaturated group and at least one second photoinitiator, wherein said second photoinitiator is present in sufficient amount to initiate the free radical polymerization of said second polymerizable component upon exposure to sufficient actinic radiation, wherein said second polymerizable component is present in sufficient amount to polymerize the second photosensitive composition when the second photosensitive composition is exposed to sufficient actinic radiation;

d) exposing the first and second photosensitive compositions to sufficient actinic radiation to polymerize the second photosensitive compositions such that the polymerized second photosensitive composition forms a cladding enveloping the core and wherein the polymerized core has a glass transition temperature of about 80° C. or less and the polymerized cladding has a glass transition temperature of about 60° C. or less, and wherein the refractive index of the cladding is less than the refractive index of the core.

The invention also provides an optical element which comprises a substrate; a patterned, light transmissive core composition on the surface of the substrate; and a light reflecting cladding composition on the pattern of the core; wherein the core composition has a glass transition temperature of about 80° C. or less and the cladding composition has a glass transition temperature of about 60° C. or less and wherein the refractive index of the cladding is less than the refractive index of the core.

The photopolymerizable compound used to form each of the cladding and core may be a monomer, oligomer or polymer which is an addition polymerizable, nongaseous (boiling temperature above 30° C. at normal atmospheric pressure), ethylenically unsaturated compound containing at least one terminal ethylenically unsaturated group, and is capable of forming a high molecular weight polymer by free radical initiated, chain propagating addition polymerization. Such compounds are well known in the art. In the preferred embodiment, at least one of said polymerizable compounds contains at least two ethylenically unsaturated groups. The photopolymerizable compounds are chosen such that after exposure they yield the below described Tg and refractive index. Multifunctional acrylate monomers are preferred.

The generalized structure of the multifunctional acrylates is given below:

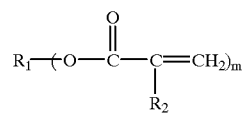

For the core, m preferably ranges from 1 to about 6; $R_2$ is H or $CH_3$, and $R_1$ is a linkage of aliphatic, aromatic or aliphatic and aromatic mixed organic molecular segments. Preferably $R_1$ is an alkylene, alkylene oxide, arylene oxide, aliphatic polyether or polyester moiety and $R_2$ is H. To ensure solvent resistance of the cured film and high contrast photolithography, crosslinked polymers and therefore multifunctional acrylate monomers ($m \geq 2$) are preferred. One of the embodiments of this invention is to reduce stress induced scattering optical loss of the final waveguiding device by using flexible, low glass transition temperature (Tg) polymers. It is known in the art that glass transition temperature (Tg) of a crosslinked polymer depends on the crosslinking density and the structure of the linkage between crosslinking points. It is also known that both low crosslinking density and flexible linkage require a low Tg. To ensure low crosslinking density, monomers with $1 \leq m \leq 3$, preferably $m=2$, and long linkage segments between two ethylenically unsaturated functionalities are preferred. For this invention, long linkage segments are those which have an average molecular chain length of at least about 4 carbon atoms or larger and preferably 6 or larger. Suitable flexible linkage structures include alkylenes with chain length larger than about 3 carbon atoms, poly(ethylene oxide), poly(propylene oxide), ethoxylated bisphenol A, polyethers, thioethers, aliphatic and aromatic hydrocarbons, ethers, esters and polysiloxanes, etc. These may optionally be substituted with any pendant group which does not detract from the ability of the polymerizable compound to photopolymerize. Suitable substitutents nonexclusively include alkyl, aryl, alkoxy and sulfoxide groups, etc. To ensure high resistance to thermal degradation and discoloration, thermally stable molecular structures of $R_1$ are preferred. Such $R_1$ segments should be free of thermally susceptible moieties such as aromatic urethane and amide groups. To ensure low birefringence, $R_1$ linkages with low stress optic coefficient and optical polarizability are preferred.

For the cladding, the acrylate is also as described above, however, the average molecular chain length between ethylenically unsaturated functionalities is preferably about 6 carbon atoms or longer, preferably 8 or longer and more preferably 12 or longer. Suitable flexible linkage structures include alkylenes with chain length larger than 6 carbon atoms, poly(ethylene oxide), poly(propylene oxide) and ethoxylated bisphenol A.

Preferred polymerizable components for both the cladding and the core are esters and partial esters of acrylic acid and of aromatic and aliphatic polyols containing preferably 2 to 30 carbon atoms. The partial esters and esters of polyoxyalkylene glycols are also suitable. Examples are ethylene glycol diacrylate, diethylene glycol diacrylate, triethylene glycol diacrylate, tetraethylene glycol diacrylate, polyethylene glycol diacrylates and polypropylene glycol diacrylates having an average molecular weight in the range from 200 to 2000, propylene glycol diacrylate, dipropylene glycol diacrylate, ($C_2$ to $C_{40}$)alkane diol diacrylates such as hexanediol diacrylate, and butanediol diacrylate, tripropylene glycol diacrylate, trimethylolpropane triacrylates, ethoxylated trimethylolpropane triacrylates having an average molecular weight in the range from 500 to 1500, pentaerythritol diacrylate, pentaeiythritol triacrylate, pentaerythritol tetraacrylate, dipentaerythritol diacrylate, dipentaerythiitol triacrylate, dipentaerythritol tetraacrylate, dipentaerythritol pentaacrylate, dipentaeryduitol hexaacrylate, tripentaerythritol octaacrylate, sorbitol triacrylate, sorbitol tetraacrylate, sorbitol pentaacrylate, sorbitol hexc ylate, oligoester acrylates, glycerol di- and triacrylate, 1,4-cyclohexane diacrylate, bisacrylates of polyethylene glycols having an average molecular weight from 100 to 1500, and mixtures of the above compounds. Preferred multifinctional acrylate oligomers include, but are not limited to acrylated epoxies, acrylated polyurethanes and acrylated polyesters. Preferred photopolymerizable compounds are aryl acrylates. Illustrative of such aryl acrylate monomers are aryl diacrylates, triacrylates and tetraacrylates as for example di, tri and tetraacylates based on benzene, naphthalene, bisphenol-A, biphenylene, methane biphenylene, trifluoromethane biphenylene, phenoxyphenylene and the like. The preferred aryl acrylate monomers are multifunctional aryl acrylates and more preferred aryl acrylate monomers are di, tri and tetra acrylates based on the bisphenol-A structure. Most preferred aryl acrylate monomers are alkoxylated bisphenol-A diacrylates such as ethoxylated bisphenol-A di-acrylate, propoxylated bisphenol A diacrylates and ethoxylated hexafluorobisphenol-A diacrylates. The aryl acrylate monomers of choice are ethoxylated bisphenol-A diacrylates. Preferred polymerizable components are monomers having the structure (I):

It is an important feature of the present invention that the photopolymerizable compounds to be used in the waveguide core produce a core which after polymerization has a glass transmission temperature of about 80° C. or less and preferably about 50° C. or less. It is an important feature of the present invention that the photopolymerizable compounds to be used in the waveguide cladding produce a cladding which after polymerization has a glass transmission temperature of about 60° C. or less, preferably about 40° C. or less and more preferably about 25° C. or less. The particular Tg may be easily obtained by the skilled artisan by characterization and selection of the polymerizable component. This depends on such factors as the molecular weight, number of sites of unsaturation and crosslink density of the polymerizable component. A single polymerized component may itself have the requisite Tg, or the polymerizable component may be tailored by blending mixtures of polymerizable monomer, oligomers and/or polymers having the desired Tg. The Tg may also be controlled by varying the exposure time and temperatures at which polymerization is conducted.

The photopolymerizable compound is present in each photopolymerizable composition in an amount sufficient to photopolymerize upon exposure to sufficient actinic radiation. The amount of the photopolymerizable compound in the composition may vary widely and amounts normally used in photopolymerizable compositions for use in the preparation of photopolymers for use as the light transmis-

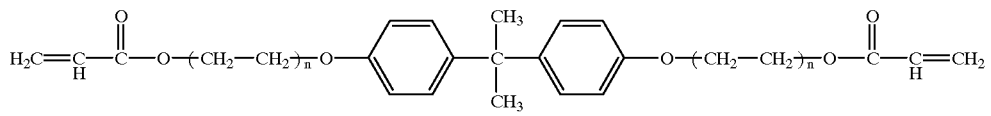

In the preferred embodiment, for the core, n is about 10 or less, preferably about 4 or less and most preferably about 2 or less. In the preferred embodiment, for the cladding, n is about 2 or more, preferably about 4 or more and most preferably about 10 or more. Also useful are acrylate containing copolymers which are well known in the art. In the preferred embodiment, the cladding layer comprises a polymerizable component which has the ethoxylated bisphenol-A disacrylate structure (I) shown above wherein $1 \leq n \leq 20$, preferably $4 \leq n \leq 15$, and more preferably $8 \leq n \leq 12$. In the most preferred embodiment of the invention, the second photosensitive composition is miscible with the polymerized first photosensitive composition at their interface.

When selecting the photopolymerizable compounds to be used in each of the core and the cladding, it is important that the core which results after full polymerization has a higher refractive index than that of the cladding after polymerization. Preferably the core has a refractive index in the range of from about 1.3 to about 1.6, or more preferably from about 1.45 to about 1.56. Preferably the cladding has a refractive index in the range of from about 1.3 to about 1.58, or more preferably from about 1.42 to about 1.55. Although the cladding and core may be comprised of structurally similar compositions, it is clear that in order for the cladding to have a refractive index which is lower than the refractive index of the core, they must have different chemical compositions for any individual application. In addition, if the chosen substrate has a refractive index which is less than that of the core, then a buffer layer is required and the buffer, as described below, must have a refractive index which is lower than that of the core.

sive element of light transmissive devices may be used The amount of photopolymerizable compound is generally used in an amount of from about 35 to about 99.9% by weight of the composition. In the preferred embodiment, the photopolymerizable compound is present in the overall composition in an amount of from about 80% to about 99.5% by weight, preferably from about 95 to about 99.5% based on the weight of the overall composition.

The each light sensitive composition further comprises at least one free radical generating photoinitiator which photolytically generates free radicals. Usually the photoinitiator is a free radical generating addition polymerization initiator activated by actinic light and is preferably thermally inactive near room temperature (e.g. from about 20° C. to about 80° C.) Any photoinitiator which is known to photopolymerize acrylates can be used. Preferred photoinitiators nonexclusively include those described in U.S. Pat. No. 4,942,112, quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon substituted aromatic acyloins in U.S. Pat. No. 2,722,512; polynuclear quinones in U.S. Pat. Nos. 2,951,758 and 3,046,127; and s-triazines in U.S. Pat. No. 4,656,272 which are incorporated herein by reference.

Suitable photoinitiators include aromatic ketones such as benzophenone, acrylated benzophenone, 2-ethylanthraquinone, phenanthraquinone, 2-tert-butylanthraquinone, 1,2-benzanthraquinone, 2,3-benzanthraquinone, 2,3-dichloronaphthoquinone, benzyl dimethyl ketal and other aromatic ketones, e.g. benzoin, benzoin ethers such as benzoin methyl ether, benzoin ethyl ether, benzoin isobutyl ether and benzoin phenyl ether, methyl benzoin, ethyl benzoin and other benzoins. Preferred photoinitiators are 1-hydroxy-cyclohexyl-phenyl ketone (Irgacure 184), benzoin, benzoin ethyl ether, benzoin isopropyl ether, benzophenone, benzodimethyl ketal (Irgacure 651), α,α-diethyloxy acetophenone, α,α-dimethyloxy-α-hydroxy acetophenone (Darocur 1173), 1-[4-(2-hydroxyethoxy)phenyl]-2-hydroxy-2-methyl-propan-1-one (Darocur 2959), 2-methyl-1-[4-methylthio)phenyl]-2-morpholino-propan-1-one (Irgacure 907), 2-benzyl-2-dimethylamino-1-(4-morpholinophenyl)-butan-1-one (Irgacure 369), poly{1-[4-(1-methylvinyl)phenyl]-2-hydroxy-2-methyl-propan-1-one} (Esacure KIP), [4-(4-methylphenylthio)-phenyl]phenylmetbanone (Quantacure BMS), di-campherquinone. The most preferred photoinitiators are those which tend not to yellow upon irradiation. Such photoinitiators include benzodimethyl ketal (Irgacure 651), α,α-dimethyloxy-a-hydroxy acetophenone (Darocur 1173), 1-hydroxy-cyclohexyl-phenyl ketone (Irgacure-184), and 1-[4-(2-hydroxyethoxy)phenyl]-2-hydroxy-2-methyl-propan-1-one (Darocur 2959).

The free radical generating photoinitiator is present in each photopolymerizable composition in an amount sufficient to effect photopolymerization of the photopolymenzable compound upon exposure to sufficient actinic radiation. The photoinitiator is generally present in an amount of from about 0.01% to about 10% by weight of the overall composition, or more preferably from about 0.1% to about 6% and most preferably from about 0.5% to about 4% by weight based on the total weight of the composition.

Other additives may also be added to the photosensitive compositions depending on the purpose and the end use of the light sensitive compositions. Examples of these include antioxidants, photostabilizers, volume expanders, fillers such as for example silica, glass spheres and the like, dyes, free radical scavengers, contrast enhancers, nitrones and UV absorbers. Antioxidants include such compounds as phenols and particularly hindered phenols including Irganox 1010 from Ciba-Geigy; sulfides; organoboron compounds; organophosphorous compounds; N, N'-hexamethylenebis(3,5-di-tert-butyl-4hydroxyhydrocinnamamide) available from Ciba-Geigy under the tradename "Irganox 1098". Photostabilizers and more particularly hindered amine light stabilizers include but are not limited to poly[(6-morpholino-s-triazine-2,4-diyl)[2,2,6,6,-tetramethyl-4-pipenidyl)imino]-hexamethylene [2,2,6,6,-tetramethyl-4-piperidyl)imino)] available from Cytec Industries under the tradename Cyasorb UV3346. Volume expanding compounds include such materials as the spiral monomers known as Bailey's monomer. Examples of dyes include methylene green, methylene blue, and the like. Suitable free radical scavengers include oxygen, hindered amine light stabilizers, hindered phenols, 2,2,6,6-tetramethyl-1-piperidinyloxy free radical (TEMPO), and the like. Suitable contrast enhancers include other free radical scavengers such as nitrones. UV absorbers include benzotriazole, hydroxybenzophenone, and the like. These additives may be included in quantities, based upon the total weight of the composition, from about 0% to about 6%, and preferably from about 0.1% to about 1%. Preferably all components of the overall composition are in admixture with one another, and most preferably in a substantially uniform admixture.

In the preferred embodiment of the invention, the optical devices of this invention are formed by applying the first photosensitive composition onto the surface of a suitable substrate. The substrate may be any material on which it is desired to establish a waveguide including semiconductor materials such as silicon, silicon oxide, gallium arsenide, silicon nitride, glass, quartz, plastics, ceramics, crystalline materials and the like. The substrate may or may not contain other devices, either topographical features such as grooves or electrical circuits or electro-optic devices such as laser diodes. On substrates where the fight transmissive region is an organic layer of lower refractive index than the substrate material, it is necessary to first form a layer of refractive index lower than the refractive index of the organic waveguide material. Such a layer is known in the art as a buffer layer and may be comprised of, for example, a semiconductor oxide, a lower refractive index polymer or a spin-on silicon dioxide glass material.

A film of the photosensitive compositions may be applied in a number of different ways known in the art, such as spin coating, dip coating, slot coating, roller coating, doctor blading, liquid casting or the like. Generally the first photosensitive composition is applied at a thickness of from about 1 micron to about 1 mm, preferably from about 5 microns to about 500 microns. Generally the second photosensitive composition is applied at a thickness of from at least about 0.01 microns, preferably at least about 1 micron.

Once the first photosensitive composition is formed onto the substrate in a thin or thick film, actinic radiation is directed onto the film in order to delineate the light transmissive region. That is, the position and dimensions of the light transmissive device is determined by the pattern of the actinic radiation upon the surface of the film on the substrate. The radiation pattern must be chosen so that the photopolyrmeizable composition is polymerized in the desired pattern and so that other regions of the film remain unreacted. The photopolymer of the invention is conventionally prepared by exposing the polymerizable composition to actinic radiation of the required wavelength and intensity for the required duration. As used herein "actinic radiation" is defined as light in the visible, ultraviolet or infrared regions of the spectrum, as well as electron beam, ion or neutron beam or X-ray radiation. Actinic radiation may be in the form of incoherent light or coherent light, for example, light from a laser. Sources of actinic light, and exposure procedures, times, wavelengths and intensities may vary widely depending on the desired degree of polymerization, the index of refraction of the photopolymer and other factors known to those of ordinary skill in the art. Such conventional photopolymerization processes and their operational parameters are well known in the art. Sources of actinic radiation and the wavelength of the radiation may vary widely, and any conventional wavelengths and sources can be used. It is preferable that the photochemical excitation be carried out with relatively short wavelength (or high energy) radiation so that exposure to radiation normally encountered before processing (e.g., room lights) will not prematurely polymerize the polymerizable material. Alternatively, the processing can utilize a multiphoton process initiated by a high intensity source of actinic radiation such as a laser. Thus, exposure to ultraviolet light (300–400 nm wavelength) is convenient Also, exposure by deep ultraviolet light (190–300 nm wavelength) is useful. Convenient sources are high pressure xenon or mercury-xenon arc lamps fitted with appropriate optical filters to select the desired wavelengths for processing. Also, short wavelength coherent radiation is useful for the practice of this invention. An argon ion laser operating in the UV mode at several wavelengths near 350 nm is desirable. Also, a frequency-doubled Argon ion laser with output near 257 nm wavelength is highly desirable. Electron beam or ion beam excitation may also be utilized. Exposure time normally varies from a few seconds to about 1 minute. Temperatures usually range from about 10° C. to about 60° C., however, room temperature is more preferred.

Control of the spatial profile of the actinic radiation, that is, where it falls on the layer of photopolymerizible material may be achieved by conventional methods. For example, in one conventional method, a mask bearing the desired light transmissive pattern is placed between the source of actinic radiation and the photopolymerizable composition film. The mask has transparent and opaque regions which allow the radiation to fall only on the desired regions of the film surface. Masked exposure of thin films is well known in the art and may include contact, proximity and projection techniques for printing the light transmissive pattern onto the film. Another conventional method of spatial control is to use a source of actinic radiation which comprises a directed or focused beam such as a laser or electron beam. Such a beam intersects only a small area of the photo-polymerizable material film surface. The pattern of the desired light transmissive regions is achieved by moving this small intersection point around on the film surface either by scanning the beam in space or by moving the substrate so that the intersection point is changed relative to a stationary beam. These types of exposure using a beam source are known in the art as direct-write methods. By choosing the spatial characteristics of irradiation, it is possible to create light transmissive regions on the surface of the substrate and produce slab and channel waveguides. A slab waveguide is one in which the optical wave is confined only to the plane of the film. A channel waveguide is one in which the optical wave is also confined laterally within the film. A channel structure is necessary for many nonlinear and electro-optic devices because it allows the light to be directed to certain areas of the substrate as well as providing a mechanism for splitting, combining optical waves and coupling light from the waveguide to optical fibers.

After the photopolymerizable composition has been polymerized to form the predetermined pattern of the photopolymer on the surface of the substrate, the pattern is then developed to remove the nonimage areas and leave behind the predetermined pattern. Any conventional development method can be used, for example, flushing with a solvent for the unirradiated composition. Such solvents include polar solvents, such as alcohols and ketones. The most preferred solvents are acetone, methanol, propanol, tetrahydrofuran and ethyl acetate.

The next step in obtaining the device of the present invention is the formation of a cladding on the waveguide core. The cladding can be any material capable of keeping applied light in the core. The cladding is formed by applying a second photosensitive composition onto the surface of the first, imagewide polymerized photosensitive composition and exposed to form a cladding. In one embodiment of the invention, the cladding is formed by a blanket exposure of the second photosensitive layer. In another embodiment of the invention, the second photosensitive layer is imagewise exposed in registration with the core pattern and developed in a manner described above. The latter structure has a cladding which covers the top and sides of the core. It is advantageous since its core exhibits low internal stresses.

In another embodiment of the invention, the optical device has a buffer layer applied to the substrate prior to application of the first photosensitive composition. The buffer layer comprises a third photosensitive composition which has a similar Tg property as the second photosensitive but need not be the identical composition. The third photosensitive composition is applied onto the surface of the substrate and overall, or non-imagewise exposed to actinic radiation. The third photosensitive composition comprises the same component parts as the second photosensitive composition. The photopolymerizable materials and processing conditions are selected such that the Tg of the polymerized buffer ranges from about 60° C. or less, preferably about 40° C. or less and more preferably about 25° C. or less.

In one preferred embodiment, the first photosensitive composition need not be fully cured, but is only partially polymerized prior to applying the second photosensitive composition. Partially polymerized means that some acrylate groups are present after polymerization, i.e., not all acrylates are converted to saturated hydrocarbons. This means that more than 0% but less than 50% of the number of acrylate groups, preferably less than about 20% of the acrylate groups remain unreacted prior to applying the second photosensitive composition. Partial polymerization of the first photosensitive composition layer prior to application of the second photosensitive composition layer, allows the two compositions to intermingle at their interface. This improves adhesion of the two layers.

After application of the second photosensitive composition, any remaining unpolymerized first photosensitive composition and the second photosensitive composition layers are subjected to a hard curing by a blanket or overall exposure to actinic radiation such that they are both substantially fully polymerized. In this manner, the core and cladding composition intermix at their interface and can be mixed in any desired proportions to fine tune the refractive indices of the cladding, core and the overall device and insure good adhesion between the layers by covalent bonding.

The method of this invention can be used for making a wide variety of optical elements. By using a suitable mask and by controlling the degree of collimation of the actinic radiation used for exposure, it is also possible to create arrays of micro-optical elements such as lenses or prisms which can be designed to transmit light in a direction roughly orthogonal to the substrate. Such optical element arrays find utility in application to backlights (e.g. for liquid crystal displays), projection systems, front or rear projection screens, diffusers, collimators, liquid crystal viewing screens, light directing arrays for collimators and lighting fixtures, exit signs, displays, viewing screens, displays for projection systems, and the like. For such application it is important to create an essentially cosmetically perfect device composed of individual elements which have sharp definition and smooth walls. The composition of the current invention can be used to enhance the critical aspects of definition and wall smoothness. For some applications, the substrate may optionally be removed from the waveguide core and cladding. The optical elements produced by the instant invention are determined to have an optical loss of about 0.1 or less and preferably about 0.05 or less 600 to 900 nm. In addition, the polymerized cladding, core and buffer layers have a Gardner index as described by ASTM D1544-80 of about 3 or less, preferably about 2 or less and more preferably about 1 or less.

Device testing and modeling suggest a device life time (time for 0.1 dB/cm loss) of more than 10 years at 120° C. (operation temperature) and more than 1 hour at 250° C. (device packaging temperature), allowing for application of devices applicable in the aerospace and military industries. Flexibility of the materials allows for fabrication of devices with desired bending angles. Cracking is also avoided even when the device is exposed to very high or very low temperatures. Good adhesion of the materials permits fabrication of robust devices on a variety of substrates without delamination even in some harsh environments such as high temperature and high humidity. Compatibility of device fabrication techniques with semiconductor industry allows for development of hybrid optoelectronic circuitry.

The following non-limiting examples serve to illustrate the invention. It will be appreciated that variations in proportions and alternatives in elements of the components of the photosensitive coating composition will be apparent to those skilled in the art and are within the scope of the present invention.

EXAMPLES

To synthesize the crosslinked photopolymers, the monomers or the oligomers were mixed with the photoinitiators and the antioxidant and well stirred. The solutions obtained were coated into thin liquid films by spin coating, slot coating or direct liquid casting with appropriate spacers. The thickness of the film was controlled by spinning speed or spacer thickness. The liquid films were placed in a sealed box of controlled atmosphere and photocured with an Oriel mercury xenon lamp (1000W) for 15 seconds in air and then 60 seconds in nitrogen. The thickness of the films below 50 mm was measured with a Sloan Dektak IIA profilometer and the thickness of the thicker films were measured with a microscope.

Example 1

A mixture containing 20.0 g ethoxylated bisphenol A diacrylate (EBDA, n=1–2 in formula I), 10.0 g 1,6-hexanediol diacrylate (HDDA), 0.6 g photoinitiator Irgacure 651, and 0.09 g antioxidant Irganox 1010 was vigorously stirred for 1 h at 60° C. to form a homogeneous solution. The solution was then coated on a substrate and cured under a mercury Xenon lamp. The coated substrate was then placed in an air purged oven and thermally baked at 190° C. for 48 h. The sample remained colorless, corresponding to Gardner color index of 1, as described by ASTM D1544-80, and there were no delamination from the substrate and no cracking in the polymer layer. The glass transition temperature measured by dynamic mechanical analysis (DMA) was 40° C.

Example 2

To a mixture containing 20.0 g ethoxylated bisphenol A diacrylate (EBDA, n=1–2 in formula I), 10.0 g 1,6-hexanediol diacrylate (HDDA), 0.6 g I-651, and 0.09 g I-1010 was added 0.3 g N-tert-butyl alpha-(p-nitrophenyl) nitrone (BNPN). The mixture was vigorously stirred to form a homogeneous solution.

Example 3

A mixture containing 20.0 g ethoxylated bisphenol A diacrylate (EBDA, n=1–2in formula 1), 10.0 g trimethylolpropane triacrylate (TMPTA), 1.8 g photoinitiator Irgacure 651, and 0.09 g antioxidant Irganox 1010 was vigorously stirred for 1 h at 60° C. to form a homogeneous solution. The solution was coated on a substrate and cured under a mercury Xenon lamp. The coated substrate was then placed in an air purged oven and thermally baked at 190° C. for 48 h. The sample was slightly yellowish, corresponding to Gardner color index of 3, as described by ASThM D1544-80, and there were no delamination from the substrate but some cracking in the polymer layer. The glass transition temperature measured by dynamic mechanical analysis (DMA) was 60° C.

Example 4

A mixture containing 20.0 g ethoxylated bisphenol A diacrylate (EBDA, n=10 in formula I), 10.0 g tripropylene glycol diacrylate (TPGDA), 0.6 g photoinitiator Irgacure 651, and 0.09 g antioxidant Irganox 1010 was vigorously stirred for 1 h at 60° C. to form a homogeneous solution. The solution was then coated on a substrate and cured under a mercury Xenon lamp. The glass transition temperature measured by dynamic mechanical analysis (DMA) was 10° C. The coated substrate was placed in an air purged oven and thermally baked at 190° C. for 48 h. The sample was slightly yellowish, corresponding to Gardner color index of 2, as described by ASTM D1544-80, and there were no delamination from the substrate and no cracking in the polymer layer.

Example 5

A mixture containing 20.0 g ethoxylated bisphenol A diacrylate (EBDA, n=10 in formula I), 10.0 g hexanediol diacrylate (HDDA), 0.6 g photoinitiator Irgacure 651, and 0.09 g antioxidant Irganox 1010 was vigorously stirred for 1 h at 60C to form a homogeneous solution. The solution was coated on a substrate and cured under a mercury Xenon lamp. The cured film was then baked at 125° C. for 1 h The glass transition temperature measured by dynamic mechanical analysis (DMA) was 15° C. The coated substrate was placed in an air purged oven and thermally baked at 190° C. for 48 h. The sample remained colorless, corresponding to Gardner color index of 1, as described by ASThM D1544-80, and there were no delamination and from the substrate and no cracking in the polymer layer.

Example 6

A mixture containing 10.0 g ethoxylated bisphenol A diacrylate (EBDA, n=10 in formula I), 20.0 g hexanediol diacrylate (HDDA), 0.6 g photoinitiator Irgacure 651, and 0.09 g antioxidant Irganox 1010 was vigorously stirred for 1 h at 60° C. to form a homogeneous solution. The solution was coated on a substrate and cured under a mercury Xenon lamp. The cured film was then baked at 125° C. for 1 h. The glass transition temperature measured by dynamic mechanical analysis (DMA) was 12° C. The coated substrate was placed in an air purged oven and thermally baked at 190° C. for 48 h. The sample was slightly yellow, corresponding to Gardner color index of 2, by ASTM D1544-80, and there were no delaminations from the substrate and no cracking in the polymer layer.

Example 7

A mixture containing 10 g polyether urethane diacrylate from Sartomer under the trade name CN 981, 20.0 g hexanediol diacrylate (HDDA), 0.6 g of a photoinitiator mixture of Irgacure 651, Irgacure 500 and Daracur 1173 at a weight ratio of 1:1:1, and 0.09 g antioxidant Irganox 1010 was vigorously stirred for 1 h at 60° C. to form a homogeneous solution. The solution was coated on a substrate and cured under a mercury Xenon lamp. The coated substrate was then placed in an air purged oven and thermally baked at 190° C. for 48 h. The sample was yellowish, corresponding to Gardner color index of 3, as described by ASTM D1544-80, and there were no delamination from the substrate and no cracking in the polymer layer. The glass transition temperature measured by dynamic mechanical analysis (DMA) is 19° C.

Comparative Example 1

A mixture containing 10.0 g aromatic polyurethane diacrylate from Biddle-Sawyer under the trade name of Genomer T-1600, 20.0 g hexanediol diacrylate (HDDA), and 0.6 g of a photoinitiator mixture of Irgacure 651, Irgacure 500 and Daracur 1173 at a weight ratio of 1:1:1 was vigorously stirred for 1 h at 60° C. to form a homogeneous solution. The solution was coated on a substrate and cured under a mercury Xenon lamp. The cured film was then baked in an air purged oven at 190° C. for 48 h. The sample was deep brown in color, corresponding to Gardner index larger than 18, as described by ASTM D1544-80. Some cracking in the polymer layer and delamination from the substrate were observed.

Compartive Example 2

A mixture containing 10.0 g Ebercyl 8800 (oligomeric aliphatic urethane acrylate with a functionality of 2.5 from Radcure), 20.0 g hexanediol diacrylate (HDDA), and 0.6 g of a photoinitiator mixture of Irgacure 651, Irgacure 500 and Daracur 1173 at a weight ratio of 1:1:1 was vigorously stirred for 1 h at 60° C. to form a homogeneous solution. The solution was coated on a substrate and cured under a mercury Xenon lamp. The cured film was then baked in an air purged oven at 190° C. for 48 h. The sample was deep brown in color, corresponding to Gardner index larger than 18, as described by ASTM D544-80. Some cracking in the polymer layer and delamination from the glass substrate were observed.

Compartive Example 3

A mixture containing 10.0 g TMPTA and 0.2 g of a photoinitiator mixture of Irgacure 651, Irgacure 500 and Daracur 1173 at a weight ratio of 1:1:1 was vigorously stirred for 1 h at 60° C. to form a homogeneous solution. The solution was coated on a substrate and cured under a mercury Xenon lamp. The cured film was then baked in an air purged oven at 190° C. for 48 h. The sample was yellowish in color, corresponding to Gardner index larger than 6, as described by ASTM D1544-80. Serious cracking in the polymer layer and delamination from the substrate were observed. The glass transition temperature measured by dynic mechanical analysis (DMA) was higher than 130° C.

Example 8

On a clean glass substrate is coated a layer of photopolymerizable composition given in Example 1. The thickness of the layer ranges from about 5 to 500 micrometers in order to form a device which is compatible with conventional glass and plastic optical fibers for low insertion loss. The photopolymerizable layer is then exposed to a beam of ultraviolet light using a mercury xenon lamp from Oriel through a photomask, which defines the desired feature and geometry of the final waveguiding device. The imagewise exposed film is developed with propanol to form a light guiding core structure. A second polymerizable composition given in Example 4, having lower refractive index than the core, is coated and blanket exposed to form a cladding layer. Subsequently, the device is baked in a nitrogen purged oven at 120° C. for 1 h.

Example 9

The photopolymerizable composition given in Example 4 is spin coated on a polyimide film substrate and blanket exposed to a beam of ultraviolet light to cure the liquid monomer composition into a solid thin film as a buffer layer. The composition given in Example 1 is then coated on top of the buffer layer as a core layer. The thickness of the core layer ranges from about 5 to 500 micrometers in order to form a device which is compatible with convention glass and plastic optical fibers for low insertion loss. The photopolymerizable core layer is then exposed to a beam of ultraviolet light through a photomask, which defines the desired feature and geometry of the final waveguiding device. The imagewise exposed film is developed with propanol to form a light guiding core structure. The polymerizable composition given in Example 4 is coated on top of the imaged core layer and blanket exposed to form a cladding layer. Subsequently, the device is baked in a nitrogen purged oven at 120° C. for 1 h.

Example 10

The photopolymerizable composition given in Example 4 is spin coated on a silicon wafer and blanket exposed to a beam of ultraviolet light to cure the liquid monomer composition into a solid thin film as a buffer layer. The composition given in Example 1 is coated on top of the buffer layer as a core layer. The photopolymerizable core layer is then exposed to a beam of ultraviolet light through a photomask, which defines the desired feature and geometry of the final waveguiding device. The imagewise exposed film is developed with propanol to form a light guiding core structure. The polymerizable composition given in Example 4 is coated on top of the imaged core layer and exposed to a beam of ultraviolet light through a photomask, which defines the desired geometry of the final cladding layer so that it, after developing with propanol, envelopes the core structure. Subsequently, the device is baked in a nitrogen purged oven at 120° C. for 1 h.

What is claimed is:

1. A method for producing an optical element on a substrate, the optical element having a light-transmissive patterned core, the method comprising the steps of:

providing a first photosensitive composition, a second photosensitive composition, and a third photosensitive composition, each of the first photosensitive composition and the second photosensitive composition and the third photosensitive composition being an admixture of a free radical polymerizable monomer, oligomer, or polymer component having at least one ethylenically unsaturated group and a photoinitiator, the free radical polymerizable monomer, oligomer, or polymer component of each admixture of the first photosensitive composition and the second photosensitive composition and the third photosensitive composition being either the same or different from one another, and the photoinitiator of each admixture of the first photosensitive composition and the second photosensitive composition and the third photosensitive composition either being the same as or different from one another;

coating the first photosensitive composition onto the substrate;

partially polymerizing the first photosensitive composition by exposure to actinic radiation to provide a uniform partially polymerized layer on the substrate, wherein the partially polymerized layer has a glass transition temperature of about 60 ° C or less;

coating the second photosensitive composition onto the first photosensitive composition such that the first photosensitive composition and the second photosensitive composition define an interface and intermingle at the interface;

partially imagewise polymerizing the second photosensitive composition by exposure to actinic radiation to define image areas and non-image areas, wherein the second photosensitive composition is partially polymerized in the image areas and generally not polymerized in the non-image areas;

removing the non-image areas of the second photosensitive composition while not removing the image areas, such that the image areas form the light-transmissive patterned core;

coating the third photosensitive composition onto the light-transmissive patterned core such that the second photosensitive composition and the third photosensitive composition define and interface and intermingle at the interface; and polymerization the second photosensitive composition and the third photosensitive composition by exposure to actinic radiation, the third photosensitive composition forming a cladding at least partially enveloping the light-transmissive patterned core, the light-transmissive patterned core having a glass transition temperature of about 80° C or less and the cladding having a glass transmissive patterned core each having a refractive index, the refractive index of the cladding being less than the refractive index of the light-transmissive patterned core.

2. The method of claim 1 wherein step (d) comprises imagewise exposing the second photosensitive composition to sufficient actinic radiation to effect a polymerization of the second photosensitive composition and forming image areas and non-image areas of the second photosensitive composition such that the polymerized second photosensitive composition forms a cladding imagewise enveloping and in register with the core, and then removing the nonimage areas of the second photosensitive composition while not removing the image areas of the second photosensitive composition.

3. The method of claim 1 wherein each exposing is conducted with a laser or ultraviolet light.

4. The method of claim 1 wherein each free radical polymerizable monomer, oligomer or polymer is an acrylate or methacrylate having at least two ethylenically unsaturated groups.

5. The method of claim 4 wherein each free radical polymerizable acrylate or methacrylate component is selected from the group consisting of one or more of ethoxylated bisphenol A diacrylate, 1,6-hexanediol diacrylate, tripropylene glycol diacrylate and mixtures thereof.

6. The method of claim 1 wherein each free radical polymerizable monomer, oligomer or polymer component is present in its respective composition in an amount of from about 35% to about 99.9% by weight of the composition.

7. The method of claim 1 wherein each photoinitiator is present in its respective composition in an amount of from about 0.01% to about 10% by weight of the composition.

8. The method of claim 1 wherein each photosensitive composition further comprises one or more compounds selected from the group consisting of antioxidants, photostabilizers, volume expanders, fillers, free radical scavengers, contrast enhancers, nitrones and dyes.

9. A method of producing an optical element which comprises:

a) coating a third photosensitive composition onto a substrate, which third photosensitive composition comprises an admixture of at least one third free radical polymerizable multifunctional monomer, or oligomer or polymer component formed from multifinctional monomer having at least one ethylenically unsaturated group and at least one third photoinitiator;

b) exposing the third photosensitive composition to sufficient actinic radiation to effect partial polymerization thereof;

c) coating a first photosensitive composition onto the partially polymerized third photosensitive composition such that the first photosensitive composition and the third photosensitive composition intermingle at their interface, which first photosensitive composition comprises an admixture of at least one first free radical polymerizable monomer, or oligomer or polymer component having at least one ethylenically unsaturated group and at least one first photoinitiator;

d) imagewise exposing the first photosensitive composition to sufficient actinic radiation to effect a polymerization thereof and forming image areas and non-image areas, wherein said first photosensitive composition is only partially polymerized in said image areas and substantially not polymerized in the non-image areas; and then removing the non-image areas while not removing the image areas, which image areas form a light transmissive patterned core;

e) coating a second photosensitive composition onto the patterned core such that the imagewise exposed first photosensitive composition and the second photosensitive composition intermingle at their interface, which second photosensitive composition comprises an admixture of at least one second free radical polymerizable monomer, or oligomer or polymer component having at least one ethylenically unsaturated group and at least one second photoinitiator; and f) exposing the first, third, and second photosenstive composition to sufficient actinic radiation to polymerize the second photosensitive compositions such that the polymerized second and third photosensitive compositions form a cladding enveloping the core, and wherein the polymerized core has a glass transition temperature of about 80° C. or less and the polymerized cladding has a glass transition temperature of about 60° C. or less, and wherein the refractive indices of the polymerized second and third photosensitive compositions are individually less than the refractive index of the core.

* * * * *